(12) United States Patent
Oyama

(10) Patent No.: US 6,791,373 B2
(45) Date of Patent: Sep. 14, 2004

(54) HIGH-VOLTAGE DETECTING CIRCUIT

(75) Inventor: Kazuhiko Oyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/673,226

(22) Filed: Sep. 30, 2003

(65) Prior Publication Data
US 2004/0130355 A1 Jul. 8, 2004

(30) Foreign Application Priority Data
Jun. 11, 2002 (JP) ........................................ 2002-323124

(51) Int. Cl.[7] .............................................. H03K 5/153
(52) U.S. Cl. ........................ 327/78; 327/198; 327/215
(58) Field of Search .............................. 327/78–81, 87, 327/99, 198, 208–210, 215, 219, 376–377, 383, 389, 427, 437

(56) References Cited
U.S. PATENT DOCUMENTS
5,151,614 A * 9/1992 Yamazaki et al. .......... 327/143
5,804,996 A * 9/1998 Verhaeghe et al. ........... 327/77
5,831,460 A * 11/1998 Zhou .......................... 327/143
6,271,571 B1 * 8/2001 Polizzi et al. ............... 257/390
6,320,802 B1 * 11/2001 Ohbayashi ................... 365/200
6,323,701 B1 * 11/2001 Gradinariu et al. .......... 327/109

FOREIGN PATENT DOCUMENTS
JP        05-259880 A       10/1993

* cited by examiner

Primary Examiner—My-Trang Nuton
(74) Attorney, Agent, or Firm—Nixon Peabody LLP; Donald R. Studebaker

(57) ABSTRACT

As a power-supply voltage VCC is applied to a second terminal, a latch is reset by a reset signal POR from a power-on reset unit. Subsequently, as the voltage of a signal IN applied to a first terminal is increased to higher than the voltage VCC by a threshold voltage Vth of a PMOS 11, the PMOS 11 turns on, causing a node N1 to become "H." Thus, a test mode is set in the latch. Subsequently, even if the signal IN is reduced to VCC or lower, the test mode is maintained. A high-voltage test can be conducted by increasing the power-supply voltage at the second terminal, thereby eliminating the need for applying the first terminal with a higher voltage than required to set the test mode. It is therefore possible to prevent a gate oxide film of a buffer from being destroyed.

14 Claims, 5 Drawing Sheets

HIGH-VOLTAGE DETECTING CIRCUIT

BACKGROUND OF THE INVENTION

1. Field of the Invention

The present invention relates to a high-voltage detecting circuit for detecting a high voltage applied to an input terminal for a use of, for example, a mode setting and the like.

2. Description of the Related Art

Japanese Patent Kokai No.5-259880, for example, can be cited as a prior art reference.

Conventionally, a voltage higher than a power supply voltage is applied to an input terminal which is commonly used for applying address signals and the like, for setting an integrated circuit to a test mode in a semiconductor device. The applied voltage is detected by a high-voltage detecting circuit to switch the integrated circuit into the test mode.

A conventional high-voltage detecting circuit comprises, for example, a P-channel MOS transistor (hereinafter, referred to as "PMOS") which has a source connected to an input terminal, a drain connected to a ground voltage GND through a resistor or the like, and a gate applied with a power supply voltage VCC. The voltage level at the drain of the PMOS is output as a detected high voltage signal.

When the common input terminal is applied with an intermediate voltage between the power supply voltage VCC and ground voltage GND (an address signal and the like) in the high-voltage detecting circuit as mentioned above, a threshold voltage Vth of the PMOS impedes a current from flowing into the PMOS, causing the level "L" to appear at the drain. On the other hand, when the input terminal is applied with a predetermined voltage (voltage higher than VCC+Vth), the PMOS turns on so that the level at the drain goes to "H." It is therefore possible to rely on the level at the drain of the PMOS to detect whether or not a high voltage is applied.

The conventional high-voltage detecting circuit, however, has the following problems.

The miniaturization of integrated circuits drives gate oxide films to be made thinner, but this trend of reducing the thickness results in a lower breakdown of the gate oxide film, so that it becomes difficult to apply a high voltage to the gate.

On the other hand, some tests conducted on semiconductor devices include a high-voltage application test which involves applying the power supply voltage VCC set higher than the voltage that should be applied during a normal operation. In this event, the high voltage applied to the input terminal for setting a semiconductor device to a test mode is increased further beyond the predetermined high voltage (VCC+Vth). Generally, the input terminal applied with the high voltage is commonly used as an input terminal for address signals and the like for avoiding an increase in the number of terminals of the semiconductor device.

Thus, if the input terminal is applied with a voltage higher than the predetermined voltage for setting the test mode, the high voltage will destroy a gate oxide film of an input circuit for the address signal.

SUMMARY OF THE INVENTION

To solve the aforementioned problem, the present invention provides a high-voltage detecting circuit for detecting application of a high voltage for a mode setting, and holding and outputting a high-voltage detecting signal. The high-voltage detecting circuit includes an input terminal which is commonly applied with a high voltage and an input signal, said high voltage being higher than a power supply voltage and said input signal having a voltage equal to or lower than the power supply voltage; a reset unit for outputting an initial reset signal when the power supply is turned on; a transistor having a source connected to said input terminal and a gate applied with the power supply voltage, said transistor turning on in response to the application of said high voltage to said input terminal, and turning off in response to the application of the input signal to said input terminal; and a latch which is reset by the initial reset signal, and set when said transistor is turned on to output a high-voltage detecting signal.

According to the present invention, the following operation is performed, since the high-voltage detecting circuit is configured in the foregoing manner.

As the power supply voltage is applied, the reset unit outputs the initial reset signal to reset the latch. As the input terminal is applied with a signal equal to or lower than the power supply voltage in this state, the input signal is processed as an input signal for a logic operation.

Then, as the input terminal is applied with a high voltage higher than the power supply voltage, the transistor turns on to set the latch which responsively outputs a high-voltage detecting signal. This causes, for example, a transition to a test mode, followed by a test operation.

DETAILED DESCRIPTION OF THE INVENTION

First Embodiment

Figure 1:
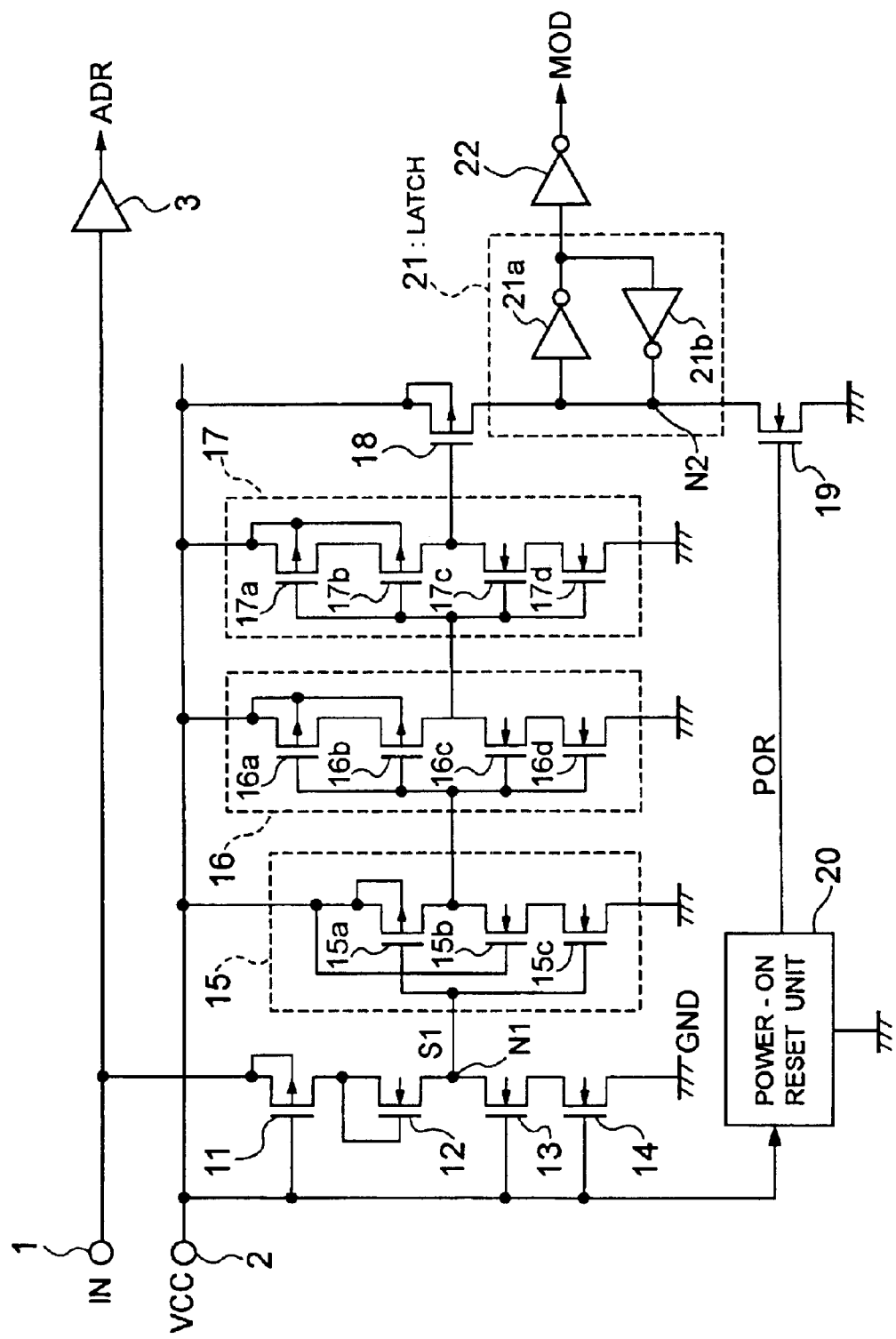
FIG. 1 is a diagram illustrating the configuration of a high-voltage detecting circuit according to a first embodiment of the present invention.

FIG. 1 is a diagram illustrating the configuration of a high-voltage detecting circuit according to a first embodiment of the present invention.

The high-voltage detecting circuit comprises a common terminal 1 which may be applied with a high voltage for setting a test mode as well as with an address signal; and a terminal 2 which is applied with a power supply voltage VCC.

A buffer 3 is connected to the terminal 1, such that an address signal ADR is output from the buffer 3. A PMOS 11 has a source which is also connected to the terminal 1. The PMOS 11 has a drain connected to a source and a gate of a PMOS 12 which has a drain connected to a node N1.

There are connected N-channel MOS transistors (hereinafter, referred to as the "NMOS") 13, 14 in series between the node N1 and the ground voltage GND. The power supply voltage VCC at the terminal 2 is applied to the
} respective gates of the PMOS 11 and the NMOS's 13, 14. The node N1 is connected to the input of an inverter 15.

The inverter 15 comprises a PMOS 15a and an NMOS 15b, 15c connected in series between the power supply voltage VCC and ground voltage GND. The PMOS 15a and NMOS 15c have their gates connected to the node N1. The NMOS 15b has a gate connected to the power supply voltage VCC so that the NMOS 15b is set on at all times. An inverted signal of a signal at the node N1 is output from a connection of the respective drains of the NMOS 15b and PMOS 15a. The output of the inverter 15 is connected to an inverter 16.

The inverter 16 has PMOS's 16a, 16b and NMOS's 16c, 16d connected in series between the power supply voltage VCC and the ground voltage GND. The MPOS's 16a, 16b and NMOS's 16c, 16d have their gates commonly connected to the output of the inverter 15, so that a connection of drains of the PMOS 16b and NMOS 16c serves as the output of the inverter 16. There are connected two PMOS's and two NMOS's in series, respectively, as mentioned above in order to reduce a current which flows therethrough. An inverter 17 similar in configuration to the inverter 16 is connected to the output of the inverter 16.

The output of the inverter 17 is connected to a gate of a PMOS 18. The PMOS 18 has a source and a drain connected to the power supply voltage VCC and a node N2, respectively. The node N2 is connected to a drain of an NMOS 19 which has a source connected to the ground voltage GND, and a gate applied with a reset signal POR from a power-on reset unit 20. The power-on reset unit 20 outputs the reset signal POR of "H" having a certain pulse width when the terminal 2 is applied with the power supply voltage VCC.

The node N2 is connected to a latch 21. The latch 21 comprises two inverters 21a, 21b connected in loop, where the input of the inverter 21a and the output of the inverter 21b are connected to the node N2, and an inverted signal of a signal at the node N2 is held at a connection of the output of the inverter 21a with the input of the inverter 21b, and output from the connection. An inverter 22 is connected to the output of the latch 21 such that a mode signal MOD is output from the inverter 22.

Figure 2:
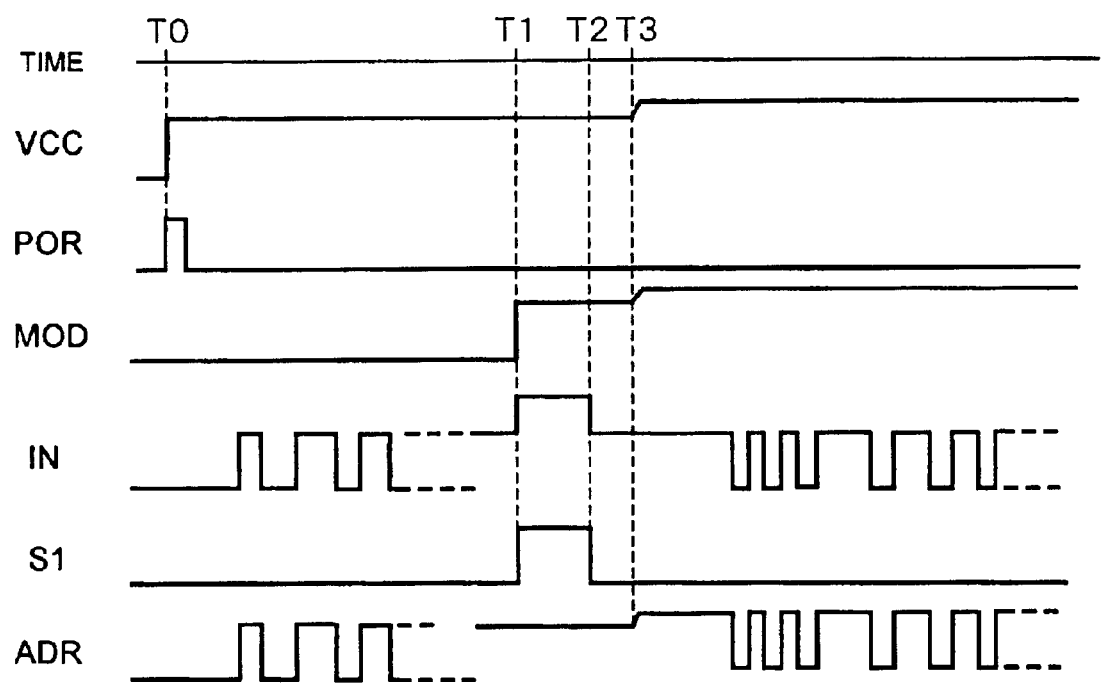
FIG. 2 is a time chart showing the operation of the high-voltage detecting circuit in FIG. 1.

FIG. 2 is a time chart showing the operation of the high-voltage detecting circuit in FIG. 1. In the following, the operation of the high-voltage detecting circuit in FIG. 1 will be described with reference to FIG. 2.

At time T0 in FIG. 2, the terminal 2 is applied with the power supply voltage VCC, while the terminal 1 is applied with a signal IN equal to or lower than the power supply voltage VCC, permitting the circuit to start the operation. Thus, the signal IN at the terminal 1 is applied to internal circuits, not shown, through the buffer 3 as an address signal ADR.

On the other hand, the PMOS 11 turns off since the source voltage of the PMOS 11 becomes lower than the gate voltage. The NMOS's 13, 14 turn on since the power supply voltage VCC is applied to the gates of the NMOS's 13, 14. Consequently, a signal S1 at the node N1 goes to "L" and is applied to the gate of the PMOS 18 through the inverters 15, 16, 17. This causes the PMOS 18 to turn off.

As the power supply is turned on supply a voltage VCC, the power-on reset unit 20 outputs the reset signal POR to be applied to the gate of the NMOS 19. While the reset signal POR is being output, the NMOS 19 remains in the on-state, and the node N2 is substantially at the ground voltage GND. Consequently, the latch 21 is reset, and the mode signal MOD output from the inverter 22 becomes to "L."

Subsequently, as the signal IN at the terminal 1 changes between "H" and "L" without exceeding the power supply voltage VCC, the signal IN is applied to internal circuits through the buffer 3 as an address signal ADR. On the other hand, since the PMOS 11 remains off as long as the signal IN is equal to or lower than the power supply voltage VCC, the signal S1 at the node N1 remains at "L" without change, forcing the mode signal MOD to remain at "L."

As the terminal 1 is applied with the signal IN at a voltage equal to or higher than VCC+Vth at time T1, the PMOS 11 turns on. Thus, the voltage at the terminal 1 is applied to the node N1 through the PMOS 11 and the NMOS 12, causing the signal S1 at the node N1 to become "H." As the signal S1 becomes "H", the PMOS 18 to turn on, and the voltage at the node N2 to increase approximately to the power supply voltage VCC, thereby setting the latch 21. Then, the mode signal MOS goes to "H."

As the signal IN at the terminal 1 returns to the power supply voltage VCC at time T2, the signal S1 at the node N1 returns to "L." While this causes the PMOS 18 to turn off, the contents held in the latch 21 remain unchanged, and the mode signal MOD also remains at "H."

At time T3, the power supply voltage VCC at the terminal 2 is increased to be higher than the normal voltage for conducting a high-voltage application test. The increase of the power supply voltage VCC causes a rise in the level "H" of internal signals such as the mode signal MOD, address signal ADR and the like, and the test is conducted at the increased level.

As described above, the high-voltage detecting circuit of the first embodiment comprises the PMOS 11 which turns on when the signal IN at the terminal 1 is higher than the power supply voltage VCC at the terminal 2 by a certain value; and the latch 21 for latching the state of the PMOS 11 when the PMOS 11 turns on. With this configuration, after the latch 21 is once set, the terminal 1 need not be continuously applied with the high voltage.

Therefore, for conducting the high-voltage application test, the terminal 2 is first applied with the normal power supply voltage VCC, while the terminal 2 is applied with a normal high-voltage for setting the test mode to set the mode signal MOD. Subsequently, the power supply voltage VCC at the terminal 2 may be increased to a predetermined high-voltage. In this event, since the signal IN at the terminal 1 may be a "H" or "L" level signal, the buffer 3 connected to the terminal 1 for input is not applied with a higher voltage than required, advantageously eliminating the possibility of destroying the gate oxide film.

Second Embodiment

Figure 3:
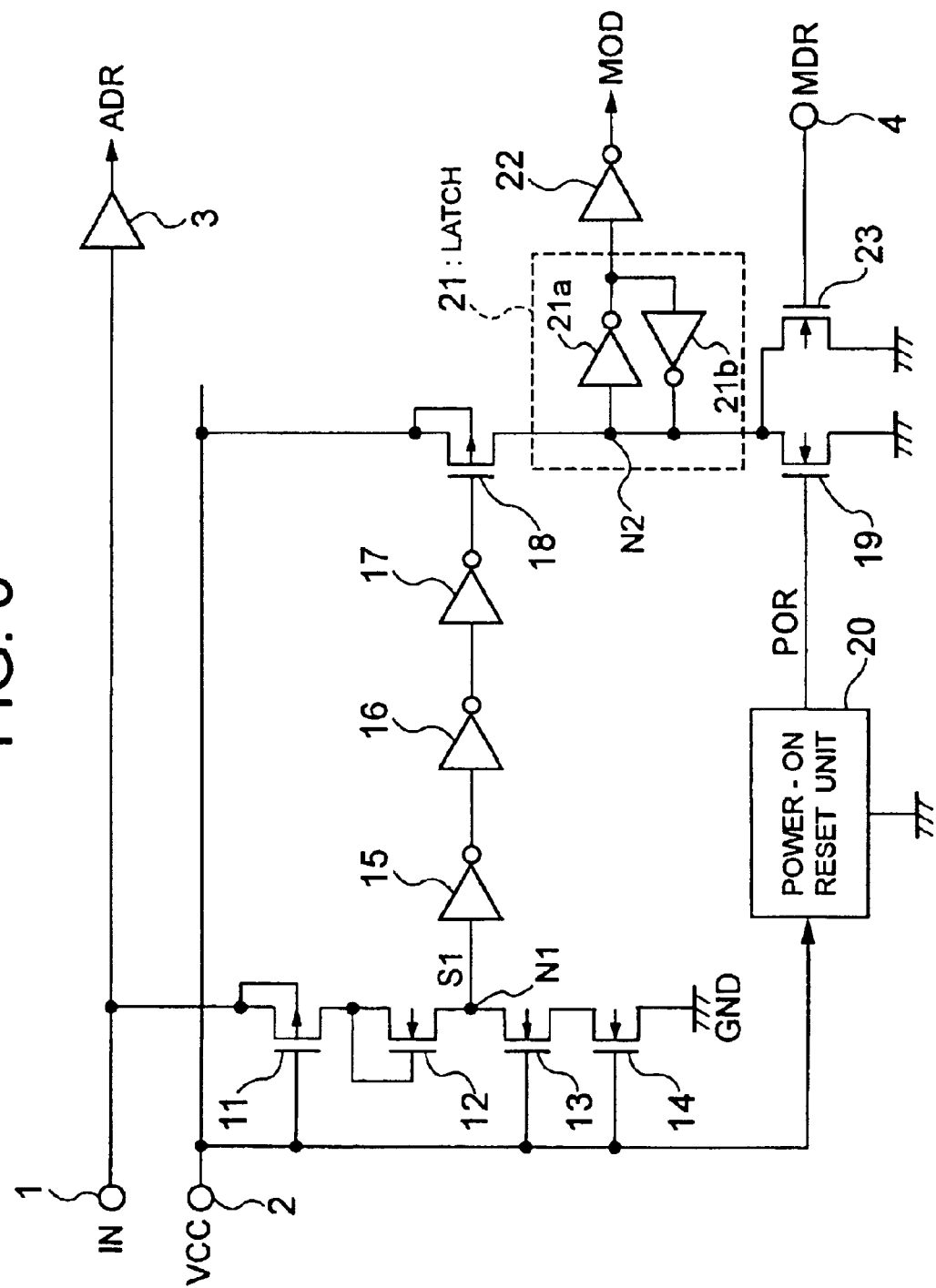
FIG. 3 is a diagram illustrating the configuration of a high-voltage detecting circuit according to a second embodiment of the present invention.

FIG. 3 is a diagram illustrating the configuration of a high-voltage detecting circuit according to a second embodiment of the present invention, where elements common to those in FIG. 1 are designated the same reference numerals.

The high-voltage detecting circuit differs from that illustrated in FIG. 1 in that an NMOS 23 is provided in parallel with the NMOS 19. There is provided a terminal 4 for externally applying a reset signal MDR to a gate of the NMOS 23. The rest of the configuration is similar to that of FIG. 1.

Figure 4:
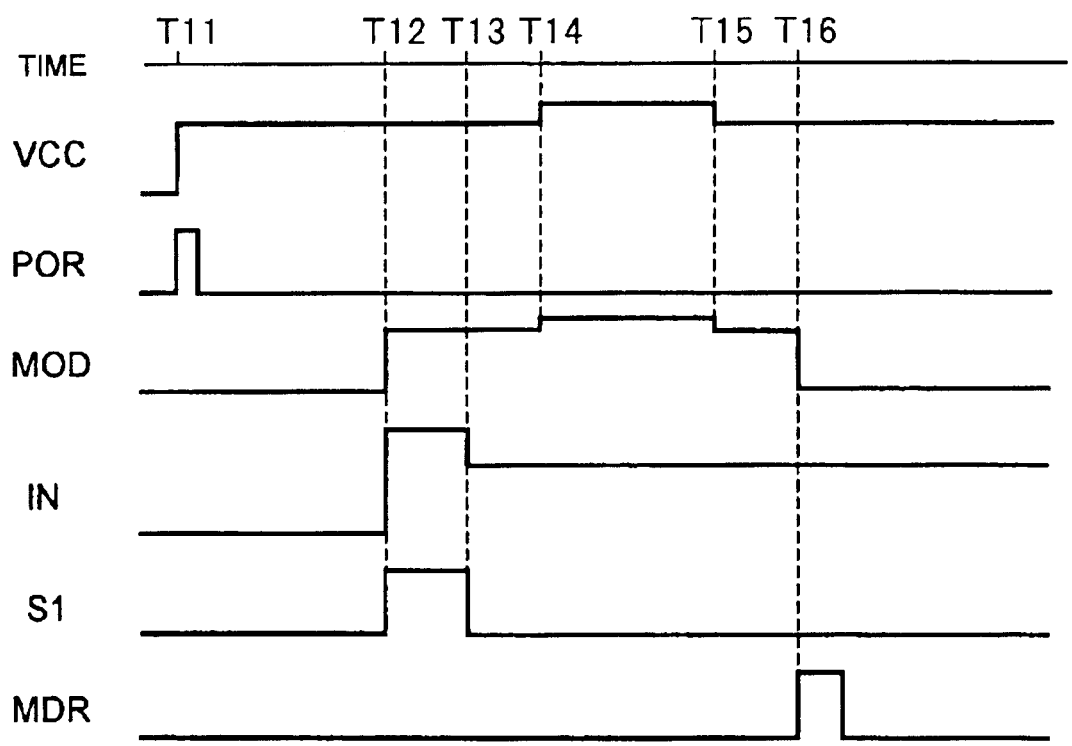
FIG. 4 is a time chart showing the operation of the high-voltage detecting circuit in FIG. 3.

FIG. 4 is a time chart showing the operation of the high-voltage detecting circuit in FIG. 3. In the following, the operation of the high-voltage detecting circuit illustrated in FIG. 3 will be described with reference to FIG. 4.

At time T11 in FIG. 4, the terminal 2 is applied with a power supply voltage VCC, while the terminal 1 is applied with the signal IN having a voltage equal to or lower than the power supply voltage VCC, permitting the circuit to start the operation. The signal IN at the terminal 1 is applied to internal circuits as an address signal ADR through the buffer 3. In this event, since the PMOS 11 has a source voltage equal to or lower than a gate voltage, the PMOS 11 turns off, and the signal S1 at the node N1 is at "L." This causes the PMOS 18 to turn off.

The application of the power supply voltage VCC causes the power-on reset unit 20 to output a reset signal POR which is applied to the gate of the NMOS 19. In this way, the NMOS 19 turns on to reset the latch 21, and the inverter 22 outputs the mode signal MOD at "L."

As the terminal 1 is applied with the signal IN at a voltage equal to or higher than VCC+Vth at time T12, the PMOS 11 turns on. This causes the signal S1 at the node N1 to become "H," and the PMOS 18 to turn on to set the latch 21. The mode signal MOD becomes "H."

At time T13, the signal IN at terminal 1 returns to the power supply voltage VCC, but the contents held in the latch 21 remain unchanged, and the mode signal MOD is maintained at "H."

At time T14, the power supply voltage VCC applied to the terminal 2 is increased to a voltage higher than the normal voltage in order to conduct a high-voltage application test. This causes internal signals such as the mode signal MOD, the address signal ADR and the like to increase their "H" level at which the test is conducted.

At time T15, the power supply voltage VCC at the terminal 2 is returned to the normal value when the high-voltage application test is finished.

As the terminal 4 is applied with the reset signal MDR for terminating the test mode, the NMOS 23 turns on and the voltage at the node N2 substantially reaches the ground voltage GND, thereby resetting the latch 21. This causes the mode signal MOD output from the inverter 22 to become "L," thereby the test mode is cleared.

As described above, the high-voltage detecting circuit of the second embodiment comprises the NMOS 23 for resetting the latch 21 using the reset signal MDR applied from the outside, in addition to the high-voltage detecting circuit of the first embodiment. The addition of the NMOS 23 advantageously eliminates the need of a power-on operation when the test mode is switched to the normal mode, and permits an immediate transition to the normal mode, in addition to the similar advantages provided by the first embodiment.

Third Embodiment

Figure 5:
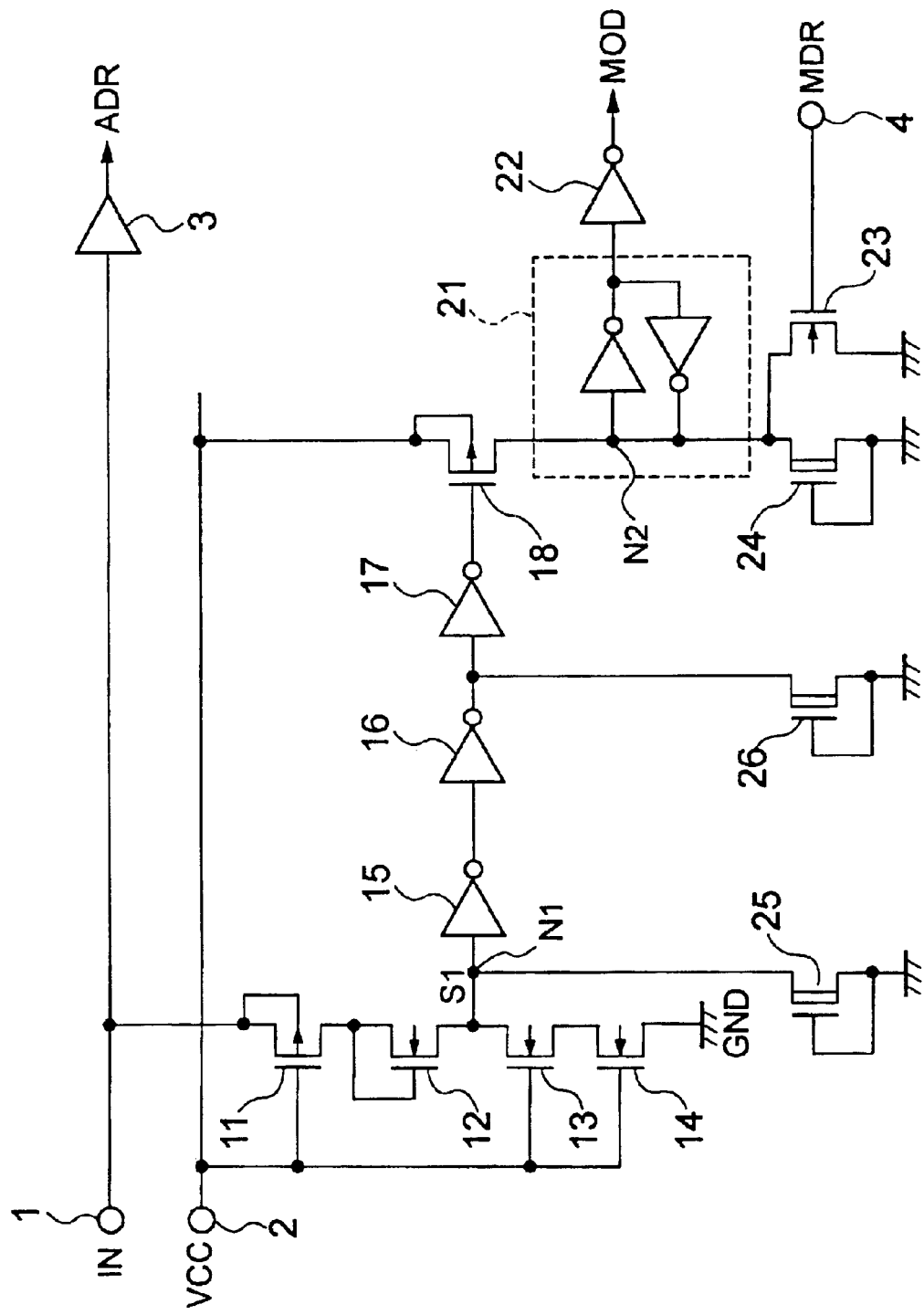
FIG. 5 is a diagram illustrating the configuration of a high-voltage detecting circuit according to a third embodiment of the present invention.

FIG. 5 is a diagram illustrating the configuration of a high-voltage detecting circuit according to a third embodiment of the present invention, where elements common to those in FIG. 3 are designated the same reference numerals.

The high-voltage detecting circuit comprises a depletion type NMOS (hereinafter, referred to as the "DMOS") 24 having a long gate length between the node N2 and the ground voltage GND, instead of the NMOS 19 and the power-on reset unit 20 in FIG. 3. There are provided similar DMOS's 25, 26 between the inputs of the inverters 15, 17 and the ground voltage GND, respectively.

Each of the DMOS's 24–26, which exhibits a predetermined on-resistance in accordance with the gate length even when the gate voltage is zero volts, has a gate connected to the ground voltage GND. In this configuration, each of the DMOS's 24–26 serves as a pull-down resistor which has a large resistance. The gate length of each of the DMOS's 24–26 is larger than those of transistors used in an output stage of the buffer 3 which constitutes part of the high-voltage detecting circuit, and in internal circuits (not shown) which may be provided beyond the buffer 3. The gate length is determined as appropriate in accordance with the value of a current flowing into the high-voltage detecting circuit when a high voltage is applied to the terminal 1.

In the high-voltage detecting circuit, when the terminal 2 is applied with the power supply voltage VCC and the terminal 1 is applied with the signal IN equal to or lower than the power supply voltage VCC upon power-on, the PMOS 18 turns off, and the node N2 is connected to the ground voltage GND through the DMOS 24 for pull-down. Consequently, the latch 21 holds "L" level at the node N2, and the inverter 22 outputs the mode signal MOD at "L."

In this event, the node N1 is also pulled down through the DMOS 25, ensuring that the signal S1 goes to "L." In addition, the input of the inverter 17 is also pulled down through the DMOS 25.

As described above, the high-voltage detecting circuit of the third embodiment comprises the pull-down DMOS 24 instead of the power-down reset unit 20 and the NMOS 19 in the high-voltage detecting circuit of the second embodiment. This can advantageously simplify the circuit configuration, in addition to the advantages of the second embodiment.

Also, the initial state can be immediately set upon power-on, thereby reducing a start-up time, since the locations of which the level is normally at "L" are connected to the ground voltage GND through the pull-down DMOS's 25, 26.

The present invention is not limited to the foregoing embodiments but can be modified in various ways. Exemplary modifications may include the followings, by way of example.

(a) The configuration of the inverters 15–17 is not limited to the one illustrated above. Specifically, each inverter may be comprised of a PMOS and an NMOS, as is usually the case.

(b) The inverters 15–17 may be removed, such that the latch is connected to the node N1.

(c) The configuration of the latch 21 is not limited to the one illustrated above. For example, a set-reset type flip-flop may be used such that the latch 21 is set by the signal S1 and reset by the reset signals POR, MDR.

(d) Instead of the DMOS's 24–26 in FIG. 5, pull-down resistors may be used.

(e) While the terminal 1 is shared for receiving a high voltage and an address signal, the terminal 1 may be shared for receiving the high voltage and another input signal.

As described above in detail, the high-voltage detecting circuit according to the present invention comprises a latch responsive to a high voltage applied to an input terminal for detecting the high voltage, holding the state, and outputting a high-voltage detecting signal. This eliminates the need for continuously applying the input terminal with a high voltage for the mode setting, and permits a high voltage test and the like to be conducted simply by increasing the power supply voltage to a predetermined voltage. Consequently, the input terminal is not applied with any high voltage equal to or higher than a predetermined voltage, thereby making it possible to prevent a gate oxide film from being destroyed in a logic circuit which shares the input terminal.

What is claimed is:

1. A high-voltage detecting circuit comprising:

an input terminal which is commonly applied with a high voltage and an input signal, said high voltage being higher than a power supply voltage and said input signal having a voltage equal to or lower than the power supply voltage;

a reset unit for outputting an initial reset signal when the power supply is turned on;

a transistor having a source connected to said input terminal and a gate applied with the power supply voltage, said transistor turning on in response to the application of said high voltage to said input terminal, and turning off in response to the application of the input signal to said input terminal; and a latch which is reset by the initial reset signal, and set when said transistor is turned on to output a high-voltage detecting signal.

2. A high-voltage detecting circuit according to claim 1, further comprising an internal circuit connected to said input terminal, wherein said high voltage is applied to said input terminal for setting a mode for said internal circuit.

3. A high-voltage detecting circuit according to claim 2, wherein said mode is set when said internal circuit is tested.

4. A high-voltage detecting circuit according to claim 1, wherein said latch includes two inverters comprised of flip-flops.

5. A high-voltage detecting circuit comprising:

an input terminal which is commonly applied with a high voltage and an input signal, said high voltage being higher than a power supply voltage and said input signal having a voltage equal to or lower than the power supply voltage;

a reset unit for outputting an initial reset signal when the power supply is turned on;

a first transistor having a source and a drain connected to said input terminal and a first node, respectively, and a gate applied with the power supply voltage, said first transistor turning on in response to the application of said high voltage to said input terminal, and turning off in response to the application of the input signal to said input terminal;

a pull-down device connected between said first node and a ground potential;

an inverter for inverting a logical value at said first node;

a second transistor connected between the power supply voltage and a second node, said second transistor being controlled between on state and off state by an output signal from said inverter;

a third transistor connected between said second node and the ground potential, which turns on in response to the initial reset signal applied thereto; and a latch for holding a potential at said second node to output the potential as a high-voltage detecting signal.

6. A high-voltage detecting circuit according to claim 5, further comprising:

a fourth transistor connected between said second node and the ground potential, which turns on in response to a mode reset signal applied thereto.

7. A high-voltage detecting circuit according to claim 6, further comprising an internal circuit connected to said input terminal, wherein said high voltage is applied to said input terminal for setting a mode for said internal circuit.

8. A high-voltage detecting circuit according to claim 5, wherein said pull-down device includes a depletion type MOS transistor.

9. A high-voltage detecting circuit according to claim 5, further comprising an internal circuit connected to said input terminal, wherein said high voltage is applied to said input terminal for setting a mode for said internal circuit.

10. A high-voltage detecting circuit according to claim 5, wherein said latch includes two inverters comprised of flip-flops.

11. A high-voltage detecting circuit comprising:

an input terminal which is commonly applied with a high voltage and an input signal, said high voltage being higher than a power supply voltage and said input signal having a voltage equal to or lower than the power supply voltage;

a first transistor having a source and a drain connected to said input terminal and a first node, respectively, and a gate applied with the power supply voltage, said first transistor turning on in response to the application of said high voltage to said input terminal, and turning off in response to the application of the input signal to said input terminal;

a first pull-down device connected between said first node and a ground potential;

an inverter for inverting a logical value at said first node;

a second transistor connected between the power supply voltage and a second node, said second transistor being controlled between on state and off state by an output signal from said inverter;

a second pull-down device connected between said second node and the ground potential;

a third transistor connected between said second node and the ground potential, which turns on in response to an external reset signal applied thereto; and a latch for holding a potential at said second node to output the potential as a high-voltage detecting signal.

12. A high-voltage detecting circuit according to claim 11, wherein said pull-down device includes a depletion type MOS transistor.

13. A high-voltage detecting circuit according to claim 11, further comprising an internal circuit connected to said input terminal, wherein said high voltage is applied to said input terminal for setting a mode for said internal circuit.

14. A high-voltage detecting circuit according to claim 11, wherein said latch includes two inverters comprised of flip-flops.

* * * * *